United States Patent
Yagura et al.

[11] Patent Number: 6,037,663
[45] Date of Patent: *Mar. 14, 2000

[54] OHMIC ELECTRODE STRUCTURE FOR $In_xGa_{1-x}As$ LAYER

[75] Inventors: Motoji Yagura, Tenri; Masanori Kominami, Yamatokoriyama; Toshiaki Kinosada, Izumi; Koken Yoshikawa, Ikoma; John Kevin Twynam, Tenri, all of Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/121,794

[22] Filed: Sep. 15, 1993

[30] Foreign Application Priority Data

Sep. 18, 1992 [JP] Japan .................................. 4-249397

[51] Int. Cl.[7] .......................... H01L 23/48; H01L 23/52; H01L 29/40
[52] U.S. Cl. ......................... 257/751; 257/764; 257/767; 257/744
[58] Field of Search ................................... 257/767, 743, 257/744, 745, 52, 751, 763

[56] References Cited

FOREIGN PATENT DOCUMENTS 62-213158  9/1987  Japan ..................................... 257/745
63-276267  11/1988  Japan .

OTHER PUBLICATIONS

Barrier Layers: Principles and Applications in Microelectronics—Marc Wittmer—J. Vac Sci Technol. A 2(2) Apr.–Jun. 1984 pp. 273–280.

Ishii, K., et al., "High–Temperature Stable $W_5Si_3$/$In_{0.53}Ga_{0.47}As$ Ohmic Contacts to GaAs for Self–Aligned HBTS" *IEDM* (1986) pp. 274–277.

*Primary Examiner*—Sheila V. Clark
*Attorney, Agent, or Firm*—Morrison & Foerster LLP

[57] ABSTRACT

An ohmic electrode structure is produced by developing an $In_xGa_{1-x}As$ layer epitaxially on a compound semiconductor (n-Ga As), and providing a barrier layer composed of a tungsten nitride (high melting point metallic nitride) by sputtering. Then, electrode patterning is performed on the top of the tungsten nitride barrier layer by the photo-resist technique. After the process, unnecessary portion of the tungsten nitride barrier layer is removed by the reactive ion etching (RIE). On the top of this a Ti layer, a Pt layer and an Au layer are deposited in layers in that order by the lift-off technique to form a metal layer. Here, molybdenum nitride or titanium nitride may be used in place of tungsten nitride.

5 Claims, 2 Drawing Sheets

OHMIC ELECTRODE STRUCTURE FOR $IN_xGA_{1-x}AS$ LAYER

BACKGROUND OF THE INVENTION

(1) Field of the Invention

The present invention relates to a structure of ohmic electrodes on compound semiconductors.

(2) Description of the Prior Art

In the prior art of preparing compound semiconductor devices, formation of the ohmic contacts on n-GaAs as a compound semiconductor is performed by epitaxially growing an $In_xGa_{1-x}As$ layer ($0<x\leq 1$) on the n-GaAs and depositing in layers a metal or an alloy to form electrodes. FIGS. 1 and 2 show prior art examples of ohmic electrode structures.

In a case of the conventional example shown in FIG. 1, an $In_xGa_{1-x}As$ layer 20 is formed on a compound semiconductor (n-GaAs) 10, and there is provided on the top of the layers a metal layer 40 consisting of a Ti layer 41, a Pt layer 42 and an Au layer 43.

On the other hand, in a case of the conventional example shown in FIG. 2, there is formed on a compound semidoncuctor (n-GaAs) 10 an $In_xGa_{1-x}As$ layer 20, on which a barrier layer 35 consisting of tungsten silicide (WSi) is layered. In addition, a metal layer 40 consisting of a Ti layer 41, a Pt layer 42 and an Au layer 43 are provided on the top of the layers in order to form electrodes. More clearly, contrasting the structure with that shown in FIG. 1, this second structure is constructed such that tungsten silicide barrier layer 35 is provided between $In_xGa_{1-x}As$ layer 20 and metal layer 40 (see Japanese Patent Application Laid-Open Sho 63 No.276267).

In the case of the conventional example shown in FIG. 1, metal layer 40 (Ti/Pt/Au) forming an electrode is liable to react with $In_xGa_{1-x}As$ layer 20. More specifically, the metal (Ti/Pt/Au) constituting metal layer 40 is easy to diffuse into $In_xGa_{1-x}As$ layer 20, and the metal (In/Ga/As) constituting $In_xGa_{1-x}As$ layer 20 is also subject to diffuse into metal layer 40. Therefore, this structure could not be treated at a greatly elevated temperature after the formation of the electrodes. For instance, if the layered structure was heated at 390° C. for one minute, the contact resistance $\rho_c$ of the structure would be increased by about three orders from the order of $10^{-8}$ $\Omega cm^2$ to the order of $10^{-5}$ $\Omega cm^2$.

In the case of the conventional example shown in FIG. 2, because tungsten silicide barrier layer 35 is provided between $In_xGa_{1-x}As$ layer 20 and metal layer 40 (Ti/Pt/Au), the structure is stable presenting no increase in its contact resistance even if it is subjected to heat treatment of 400° C. or more. Nevertheless, the composition control of the barrier layer is difficult to achieve since the sputtering efficiencies (the WSi (tungsten silicide) is formed by sputtering.) are different between W and Si. Further, it is impossible to increase the purity of WSi to a great extent since WSi is a sintered body. There is also another drawback that the workablity is low since WSi generally assumes a columnar polycrystalline structure.

SUMMARY OF THE INVENTION

The present invention has been achieved in view of the above circumstances, and it is therefore an object of the present invention to provide an ohmic electrode structure in which the contact resistance remains stably low even if the structure is subjected to heat treatment at an elevated temperature, and which is excellent in workablity without necessity of a complicated composition control.

An aspect and feature of the present invention resides in that an ohmic electrode structure having a layered structure comprises a compound semiconductor, an $In_xGa_{1-x}As$ layer ($0<x\leq 1$) on the compound semiconductor, a barrier layer on the $In_xGa_{1-x}As$ layer and a metal layer including at least one metal sub-layer, and the barrier layer is composed of a metallic nitride having a high melting point.

The metallic nitride having a high melting point provided as a barrier layer between the $In_xGa_{1-x}As$ layer and the metal layer, reliably prevents the diffusion of the metal components in the metal layer into $In_xGa_{1-x}As$ layer and the diffusion of the metal components in $In_xGa_{1-x}$ As layer into the metal layer. As a result, it is possible to stabilize the contact resistance at low level even if the structure is subjected to heat treatment at an elevated temperature after the formation of the electrodes.

Further, the metallic nitrides having high melting points assume amorphous structures so that they can be readily processed in contrast to the tungsten silicide, which takes a columnar polycrystalline structure. In addition, any difficulty that would be caused in controlling the composition by the difference of sputtering efficiencies in the prior art does not occur since the target material to be sputtered is composed of only one metal, that is, tungsten, molybdenum, titanium or the like.

DESCRIPTION OF THE PREFERRED EMBODIMENTS

A basic configuration of an ohmic electrode structure according to the present invention will hereinafter be described with reference to the accompanying drawings.

Figure 1:
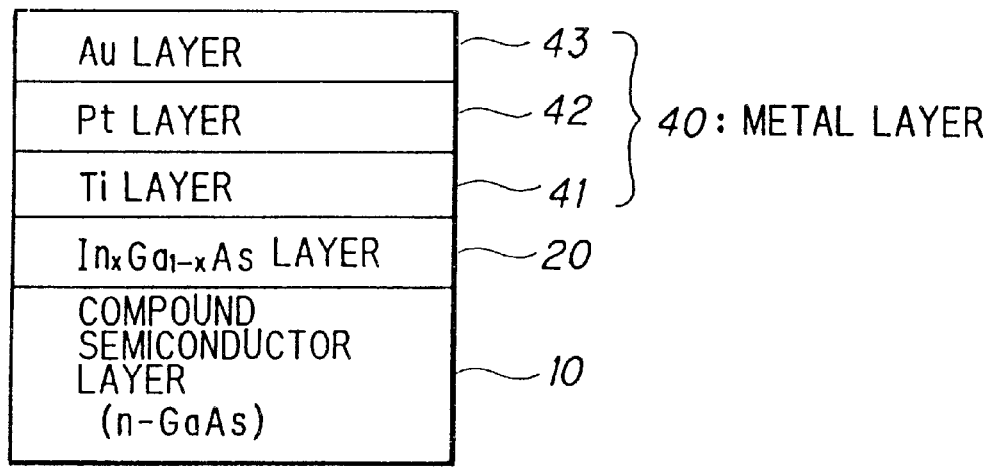
FIG. 1 is a cross-sectional view schematically showing an ohmic electrode structure according to a prior art example.
Figure 2:
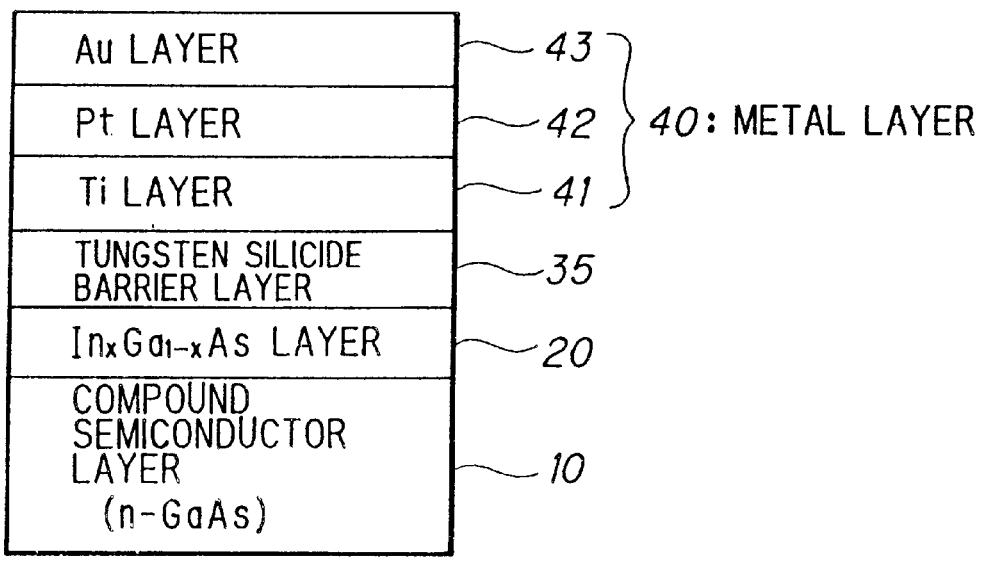
FIG. 2 is a cross-sectional view schematically showing an ohmic electrode structure according to another prior art example.
Figure 3:
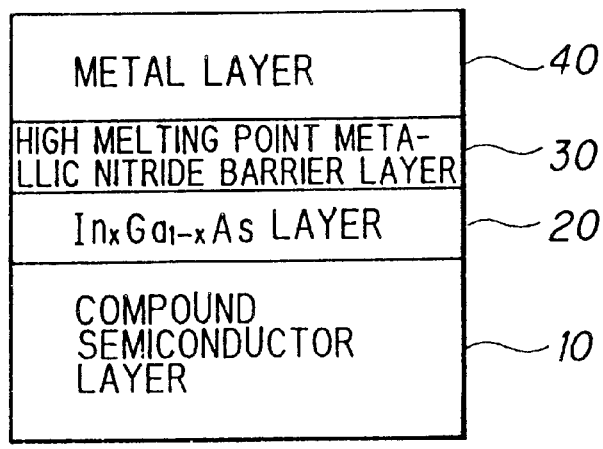
FIG. 3 is a cross-sectional view showing a typical configuration of an ohmic electrode structure according to the present invention.

First, the ohmic electrode structure according to the invention has a layered configuration composed of, as typically shown in FIG. 3, an $In_xGa_{1-x}As$ layer 20 ($0<x\leq 1$) on a compound semiconductor 10, a barrier layer 30 over $In_xGa_{1-x}As$ layer 20 and a metal layer 40 consisting of at least one sub-layer on top of barrier layer 30. The barrier layer 30 is composed of a metallic nitride having a high melting point. Examples of the high melting point metallic nitride constituting barrier layer 30 include tungsten nitride, molybdenum nitride, titanium nitride.

Figure 4:
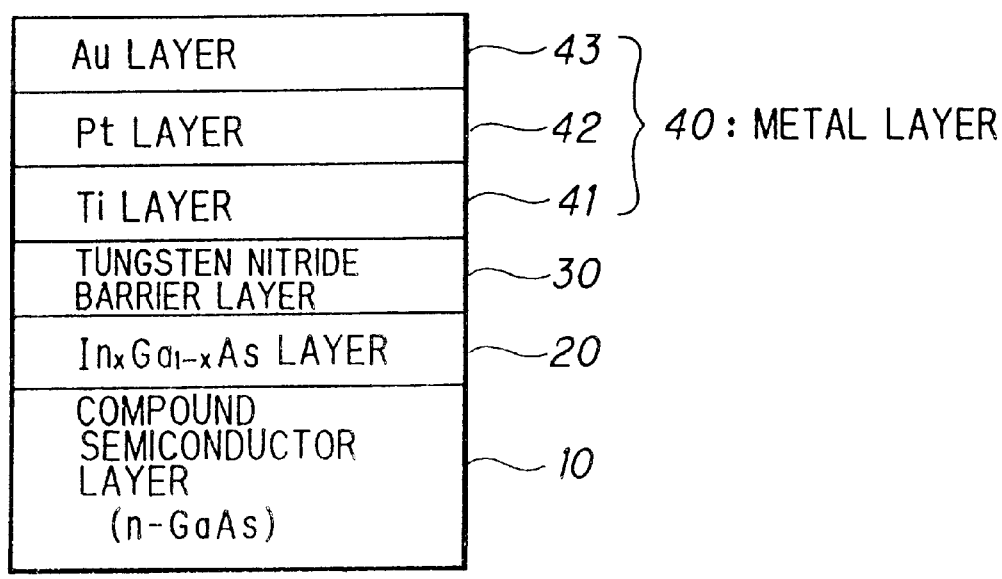
FIG. 4 is a cross-sectional view schematically showing an ohmic electrode structure according to an embodiment of the present invention.

FIG. 4 shows a schematic cross-sectional structure of an embodiment of an ohmic electrode in compound semiconductor.

$In_xGa_{1-x}As$ layer 20 (x=0.5) is developed epitaxially in layer on compound semiconductor (n-GaAs) 10. On the above surface of $In_xGa_{1-x}As$ layer 20, barrier layer 30 of tungsten nitride as mentioned above as a typical high melting point metallic nitride is formed 500 Å thick in layer by sputtering. Then, electrode patterning is performed on the top of tungsten nitride barrier layer 30 by the photo-resist technique. After the process, unnecessary portion of tungsten nitride barrier layer 30 is removed by the reactive ion etching (RIE). On the top of this a Ti layer 41 having a thickness of 500 Å, a Pt layer 42 having a thickness of 500 Å and an Au layer 43 having a thickness of 1000 Å are deposited in layers in that order by the lift-off technique to complete metal layer 40 constituting ohmic contact electrodes.

Tungsten nitride constituting barrier layer 30 has an amorphous structure, therefore, is excellent in workability. In addition, any difficulty that would be caused in controlling the composition by the difference of sputtering efficiencies does not occur since the target material to be sputtered is composed of tungsten only.

The thus structured ohmic electrode exhibits a sufficiently low contact resistance $\rho_c$ of $5\times10^{-7}$ $\Omega cm^2$. With several repetitions of heat treatments at an elevated temperature of 400° C. for five minutes, the contact resistance was found to be stable or unchanged at the low level. This is because that the tungsten nitride barrier layer 30 may reliably prevent the diffusion of the metal components (In/Ga/As) in $In_xGa_{1-x}As$ layer 20 into metal layer 40 and the diffusion of the metal components (Ti/Pt/Au) in metal layer 40 into $In_xGa_{1-x}As$ layer 20 that would have occurred under the high temperature-heat treatment.

The thus constructed ohmic electrode structure is competent for ohmic electrodes for transistors that need heat resistance, and is in particular preferable for the emitter electrode of hetero-junction bipolar transistors (HBT).

As the high melting point metallic nitride constituting high melting point metallic nitride barrier layer 30, molybdenum nitride, titanium nitride and the like can be used other than tungsten nitride. Further, metal layer 40 in the above embodiment is formed with three sub-layers but this is not intended to specify the structure of the metal layer, and the metal layer can be constituted by any number of sub-layers as long as the metal layer exists.

Although the composition of $In_xGa_{1-x}As$ layer 20 is uniform in the embodiment, this is not essential. For instance, the $In_xGa_{1-x}As$ layer can be constructed by grading x from 0 to 1. Further, a medium layer having composition-graded $In_xGa_{1-x}As$ layer (in which, for example, x varies from 0 to 0.5) can be provided on the semiconductor side, namely between GaAs and $In_yGa_{1-y}As$ (for example, y=0.5).

As has been described above, according to the present invention, the compound semiconductor is constructed by providing the barrier layer composed of a metallic nitride having a high melting point between the $In_xGa_{1-x}As$ layer and metal layer. Therefore, it is possible to obtain an ohmic electrode structure in which the contact resistance remains stably low even if the structure is subjected to heat treatment at an elevated temperature, and which can be readily controlled in composition and is excellent in workablity.

What is claimed is:

1. An ohmic electrode structure having a layered structure comprising:

a GaAs semiconductor;

an $In_xGa_{1-x}As$ layer ($0<x\leq1$) on said semiconductor;

a metal layer including at least one metal sublayer, and a barrier layer between said metal layer and said $In_xGa_{1-x}As$ layer for prevention of the diffusion of metallic components between said metal layer and said $In_xGa_{1-x}As$ layer;

said barrier layer being composed of a metallic nitride having a high melting point and having an amorphous structure and providing an ohmic interface with said $In_xGa_{1-x}As$ layer.

2. An ohmic electrode structure according to claim 1, wherein said metallic nitride having a high melting point is one selected from a group of tungsten nitride, molybdenum nitride and titanium nitride.

3. An ohmic electrode structure according to claim 1, wherein said metal layer is constructed of three sub-layers composed of Ti/Pt/Au in that order.

4. An ohmic electrode structure according to claim 2, wherein said metal layer is constructed of three sub-layers composed of Ti/Pt/Au in that order.

5. An ohmic electrode structure according to claim 1, wherein said barrier layer is constituted by a tungsten nitride layer with an amorphous structure.

* * * * *